(12) United States Patent
van der Straten et al.

(10) Patent No.: US 12,598,917 B2
(45) Date of Patent: Apr. 7, 2026

(54) ADVANCED MRAM DEVICE STRUCTURE HAVING HYPERBOLOID SHAPE

(71) Applicant: INTERNATIONAL BUSINESS MACHINES CORPORATION, Armonk, NY (US)

(72) Inventors: Oscar van der Straten, Guilderland Center, NY (US); Praneet Adusumilli, Somerset, NJ (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 755 days.

(21) Appl. No.: 17/655,795

(22) Filed: Mar. 22, 2022

(65) Prior Publication Data

US 2023/0309412 A1     Sep. 28, 2023

(51) Int. Cl.
   *H10N 50/80* (2023.01)
   *H10N 50/01* (2023.01)
   *H10N 50/85* (2023.01)

(52) U.S. Cl.
   CPC ............. *H10N 50/80* (2023.02); *H10N 50/01* (2023.02); *H10N 50/85* (2023.02)

(58) Field of Classification Search
   CPC ......... H10N 50/80; H10N 50/85; H10N 50/10
   See application file for complete search history.

(56) References Cited

U.S. PATENT DOCUMENTS

| | | |
|---|---|---|
| 7,241,632 B2 | 7/2007 | Yang |
| 7,936,027 B2 | 5/2011 | Xiao |

| | | | |
|---|---|---|---|
| 7,973,349 B2 | 7/2011 | Huai | |
| 8,313,960 B1 | 11/2012 | Abedifard | |
| 9,564,577 B1 * | 2/2017 | Hsu | H10N 50/10 |
| 9,997,566 B1 | 6/2018 | Kim | |
| 10,096,649 B2 | 10/2018 | Park | |
| 10,270,025 B2 * | 4/2019 | Chuang | H10B 61/22 |
| 10,535,814 B2 * | 1/2020 | Chuang | H10N 50/10 |
| 10,580,966 B1 * | 3/2020 | van der Straten | H10N 50/01 |
| 10,707,413 B1 | 7/2020 | Dutta | |
| 10,727,397 B1 * | 7/2020 | Wang | H10N 50/10 |
| 10,943,611 B1 * | 3/2021 | Freitag | G11B 5/235 |
| 2007/0166840 A1 | 7/2007 | Assefa | |

(Continued)

FOREIGN PATENT DOCUMENTS

| | | | | |
|---|---|---|---|---|
| CN | 105374936 A | 3/2016 | | |
| JP | 2009152444 A | * 7/2009 | ............. | H10N 50/80 |

(Continued)

*Primary Examiner* — Ida M Soward

(74) *Attorney, Agent, or Firm* — Samuel A. Waldbaum

(57) ABSTRACT

A MRAM Cell including a dielectric cap and a lower section that includes a bottom electrode, a synthetic anti-ferromagnet layer, and a reference layer, where in the sidewalls of each of the bottom electrode, the synthetic anti-ferromagnet layer, and the reference layer are angled relative to the vertical plane perpendicular to a top surface of the dielectric cap. A first dielectric liner located on the sidewalls of each of the lower section. An upper section that includes a tunnel barrier, a free layer, and a top electrode. A second dielectric liner located on a side section of the tunnel barrier, where the second dielectric liner is comprised of a second material, and where the angled side sections of the tunnel barrier are located on top of the second dielectric liner.

17 Claims, 14 Drawing Sheets

(56)                    References Cited

U.S. PATENT DOCUMENTS

| 2008/0055789 | A1* | 3/2008 | Kim | G11C 11/16 |
| | | | | 360/324 |
| 2011/0008915 | A1* | 1/2011 | Nozieres | H01L 27/00 |
| | | | | 438/3 |
| 2017/0092852 | A1* | 3/2017 | Son | H10N 50/01 |
| 2017/0125668 | A1 | 5/2017 | Paranjpe | |
| 2017/0170393 | A1 | 6/2017 | Xue | |
| 2018/0033957 | A1 | 2/2018 | Zhang | |
| 2018/0123029 | A1* | 5/2018 | Park | H10N 50/10 |
| 2018/0301624 | A1* | 10/2018 | Yang | H10B 63/30 |
| 2019/0252612 | A1* | 8/2019 | Tortorelli | H10N 70/826 |
| 2019/0371996 | A1* | 12/2019 | Chuang | H10N 50/10 |
| 2020/0006638 | A1* | 1/2020 | Chen | H10B 61/00 |
| 2020/0127047 | A1* | 4/2020 | Chen | H01L 23/5226 |
| 2021/0057639 | A1* | 2/2021 | Ku | H10N 50/10 |
| 2021/0217812 | A1* | 7/2021 | Hsiao | H01L 23/5226 |
| 2021/0327960 | A1 | 10/2021 | Xiao | |
| 2021/0375991 | A1* | 12/2021 | Ho | H10B 63/30 |
| 2021/0376231 | A1* | 12/2021 | Yin | H10N 50/80 |
| 2021/0399207 | A1* | 12/2021 | Wang | H10N 50/01 |

FOREIGN PATENT DOCUMENTS

| KR | 20210027306 | A | * | 3/2021 | | H10N 70/821 |
| WO | WO-2020095785 | A1 | * | 5/2020 | | G01R 33/093 |

* cited by examiner 120        125        115        105

110        FIG. 1

ADVANCED MRAM DEVICE STRUCTURE HAVING HYPERBOLOID SHAPE

BACKGROUND

The present invention generally relates to the field of MRAM devices, and more particularly to formation of the structure of the MRAM cell.

Multiplication operations (including convolution and matrix multiplication) are the most area and power consuming issues in hardware implementation of deep neural networks. Recent advances in reduced precision optimization suggest that at least a portion of multiplication operations may be performed at lower precision (i.e., with a fewer number of bits) without compromising the end-to-end accuracy. This provides opportunity for power and/or area saving by employing analog devices such as magnetic random-access memory (MRAM) for weight storage.

BRIEF SUMMARY

Additional aspects and/or advantages will be set forth in part in the description which follows and, in part, will be apparent from the description, or may be learned by practice of the invention.

A MRAM cell having a hyperboloid shape.

A MRAM Cell including a dielectric cap and a lower section that includes a bottom electrode, a synthetic anti-ferromagnet layer, and a reference layer, where in the sidewalls of each of the bottom electrode, the synthetic anti-ferromagnet layer, and the reference layer are angled relative to the vertical plane perpendicular to a top surface of the dielectric cap. A first dielectric liner located on the sidewalls of each of the bottom electrode, the synthetic anti-ferromagnet layer, and the reference layer, where the first dielectric layer is comprised of a first material. An upper section that includes a tunnel barrier, a free layer, and a top electrode, where the tunnel barrier has a horizontal bottom section located on top of the reference layer, where the tunnel barrier has angled vertical sided sections. A second dielectric liner located on a side section of the tunnel barrier, where the second dielectric liner is comprised of a second material, and where the angled side sections of the tunnel barrier are located on top of the second dielectric liner.

A method for forming an MRAM cell on a dielectric cap including the step of forming a lower section of the MRAM cell. Forming a bottom electrode and forming a synthetic anti-ferromagnet layer on top of the bottom electrode. Forming a reference layer on top of the synthetic anti-ferromagnet layer. Etching the bottom electrode, the synthetic anti-ferromagnet layer, and the reference layer to form a mesa shape, where in the sidewalls of each of the bottom electrode, the synthetic anti-ferromagnet layer, and the reference layer are angled relative to the vertical plane perpendicular to a top surface of the dielectric cap. Forming a first dielectric liner located on the sidewalls of each of the bottom electrode, the synthetic anti-ferromagnet layer, and the reference layer, where the first dielectric layer is comprised of a first material. Forming an interlayer dielectric layer to surround the lower section of the MRAM cell. Forming an upper section of the MRAM cell by forming a trench in the interlayer dielectric layer to expose a top surface of the reference layer. Forming a second dielectric liner on the side surfaces of the trench, where the side surface of the trenched are angled, and where the angle of the side surface of the trench is in the range of about 30 to 75 degrees relative to the vertical plane perpendicular to a top surface of the reference layer. Forming a tunnel barrier on the top surface of the reference layer and on a top surface of the second dielectric layer. Forming a free layer located on top of the tunnel barrier and forming a top electrode on top of the free layer.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1:
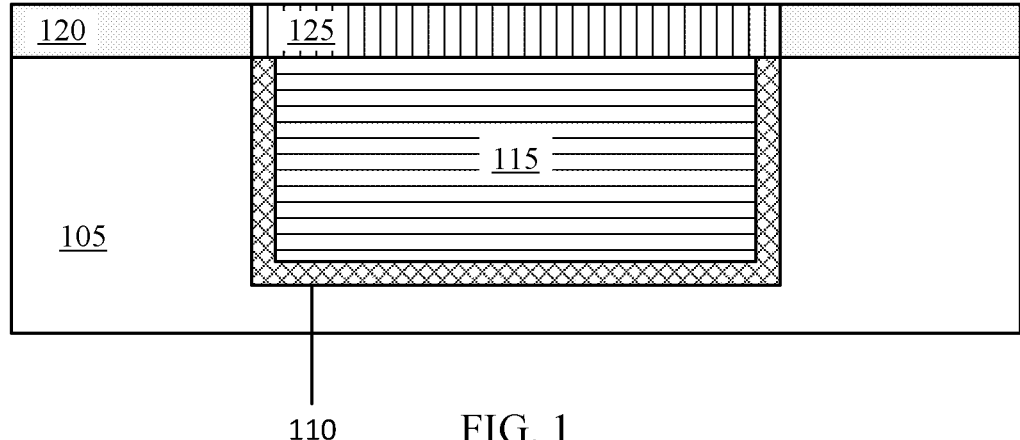
FIG. 1 illustrates a cross section of MRAM device, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. Magneto resistive random-access memory (MRAM) is becoming more and more attractive in industry because of its promising prospects for replacing or extending various well-developed memory technologies. It can fulfill not only the speed requirements of cache memory and dynamic random-access memory (DRAM) with additional nonvolatility but also the capacity demand of hard-disk drive (HDD) and solid-state drive (SSD). So far, much effort has been devoted to spin-transfer torque-based MRAM (STT-MRAM) in which the write and read operations share the same current path flowing through the tunnel barrier of magnetic tunnel junction (MTJ) which serves as the bit storage and readout element. Presently, this physical limit still leads to considerable write error rates, access time above ~10 ns, aging of tunnel barriers, and suboptimal power consumption in MRAM. Spin-orbit torque-based MRAM (SOT-MRAM) can have significantly improved performance on these metrics by using decoupled read and write paths or by using novel materials with giant SOT effect. The present invention is directed to the formation of an advanced MRAM cell structure. The etching process to form the MRAM cell can cause defects in the tunnel barrier. The etching process can cause the material of the etch layers to scatter back or re-sputtering on to a side surface of the tunnel barrier. The tunnel barrier is a relatively thin layer thus the scattered materials located on the sidewalls of the tunnel barrier will cause defects. The present invention is directed to a multistage process to form the MRAM cell to avoid defects to the tunnel barrier caused by the etching process. The MRAM device has a lower section etched prior to the formation of the tunnel barrier, thus preventing any scattering/re-sputtering of material on to the tunnel barrier. The bottom section of MRAM device is enclosed by a dielectric layer. The dielectric layer is etched to allow for the formation of the top section of the MRAM device, which includes the tunnel barrier. Defects/shorts in the tunnel barrier of the MRAM cell is prevented by forming the lower section cell prior the formation of the top section of the cell.

FIG. 1 illustrates a cross section of MRAM device, in accordance with the embodiment of the present invention. The MRAM devices includes a first interlayered dielectric 105, a first liner 110, a metal layer 115, a metal cap 125, and a dielectric cap 120. The dielectric cap 120 can be comprised of, for example, SiN, SiCN, or another suitable dielectric material.

Figure 2:
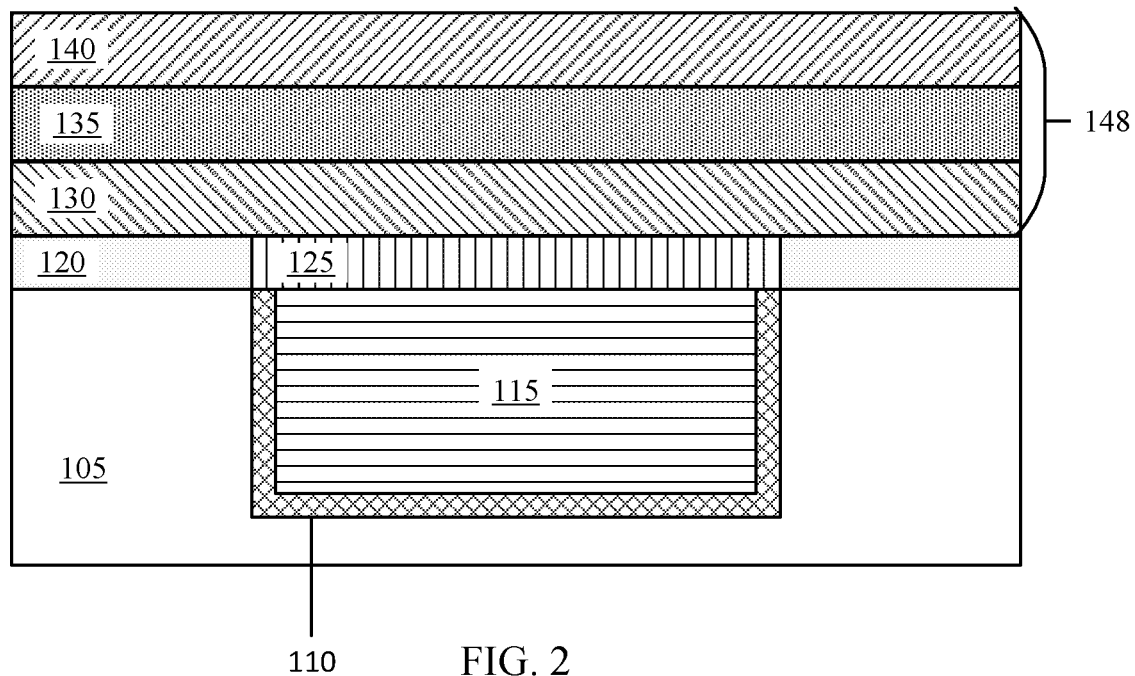
FIG. 2 illustrates a cross section of MRAM device after the formation of the lower layers, in accordance with the embodiment of the present invention.

FIG. 2 illustrates a cross section of MRAM device after the formation of the lower section layers, in accordance with the embodiment of the present invention. The lower section layers include a bottom electrode 130, a synthetic anti-ferromagnet layer 135, and the reference layer 140. The bottom electrode 130 can be comprised of, for example, TiN, TaN, WN, MoN, Ti, Ru, other suitable conductive metals, conductive alloys, or a combination thereof. The material for the reference layer 140 can be selected from a group that includes CoFeB layers with Fe Co, Pt, or Ta.

Figure 3:
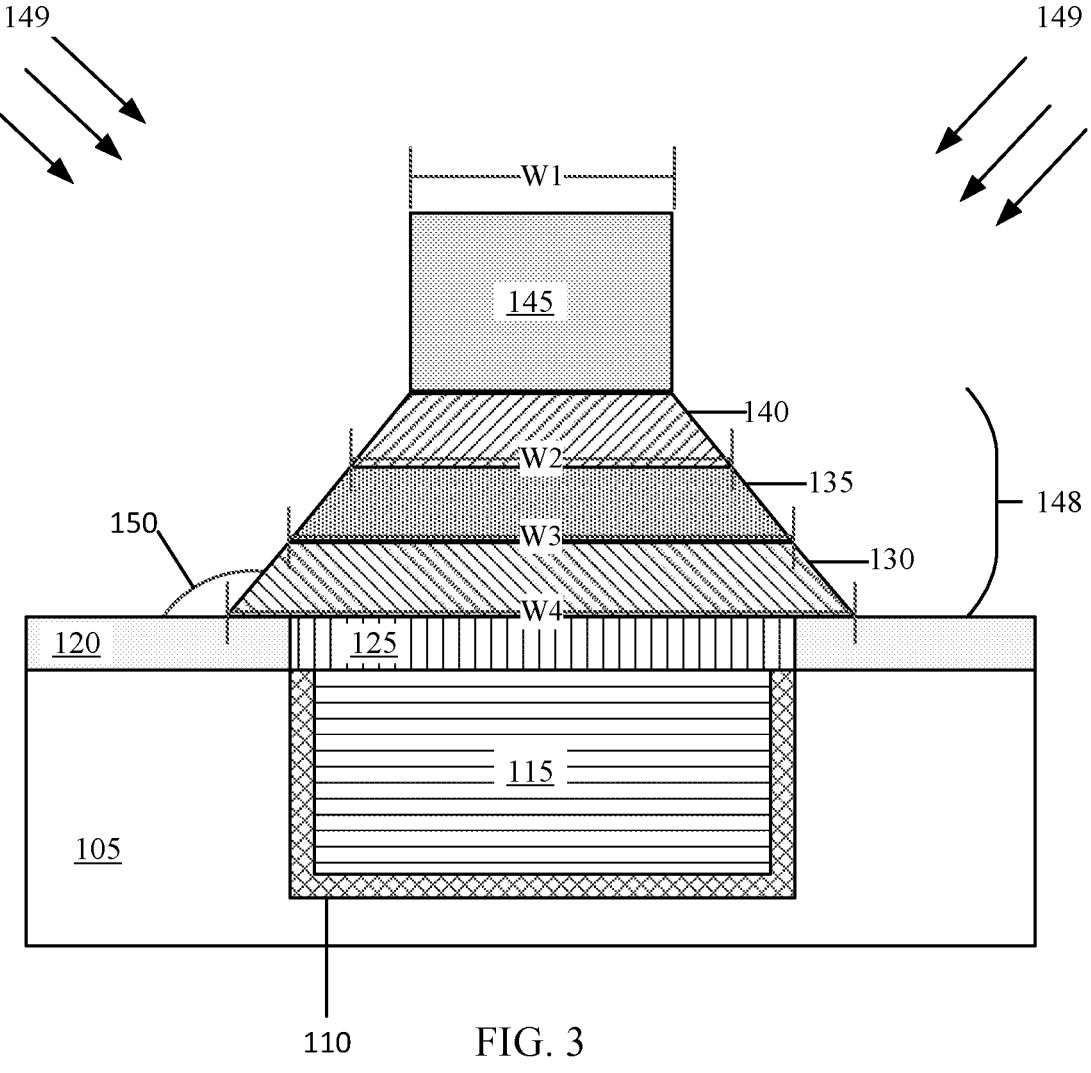
FIG. 3 illustrates a cross section of MRAM device after the formation of a hardmask and etching lower layers, in accordance with the embodiment of the present invention.

FIG. 3 illustrates a cross section of MRAM device after the formation of a hardmask 145 and etching lower layers 148 which include the bottom electrode 130, the synthetic anti-ferromagnet layer 135, and the reference layer 140, in accordance with the embodiment of the present invention. First, a hardmask 145 is located on top of the reference layer 140.

Next, the lower layers 148 are etched using an ion beam etching process 149. The ion beam etching allows for the lower layers to be etched at an angle 150 with respect to a top surface of the dielectric cap 120. The angle 150 of the side walls of the lower layers in the range of about 30 to 75 degrees relative to a vertical plane perpendicular to a top surface of the dielectric cap 120. After etching, each of the lower layers 148 (i.e., the bottom electrode 130, the synthetic anti-ferromagnet layer 135, and the reference layer 140) have a relatively narrow width at the top surface of each layer and as each layer extends downwards the width of each layer progressively increases.

The reference layer 140 has top surface has a width W1 and the bottom surface of the reference layer 140 has a width W2, where the width W1 is less than W2. The synthetic anti-ferromagnet layer 135 has atop surface has a width W2 and the bottom surface of the synthetic anti-ferromagnet layer 135 has a width W3, where the width W2 is less than W3. The bottom electrode 130 has a top surface has a width W3 and the bottom surface of the bottom electrode has a width W4, where the width W3 is less than W4. The widths of the layers have the following relationships where W1<W2<W3<W4.

Figure 4:
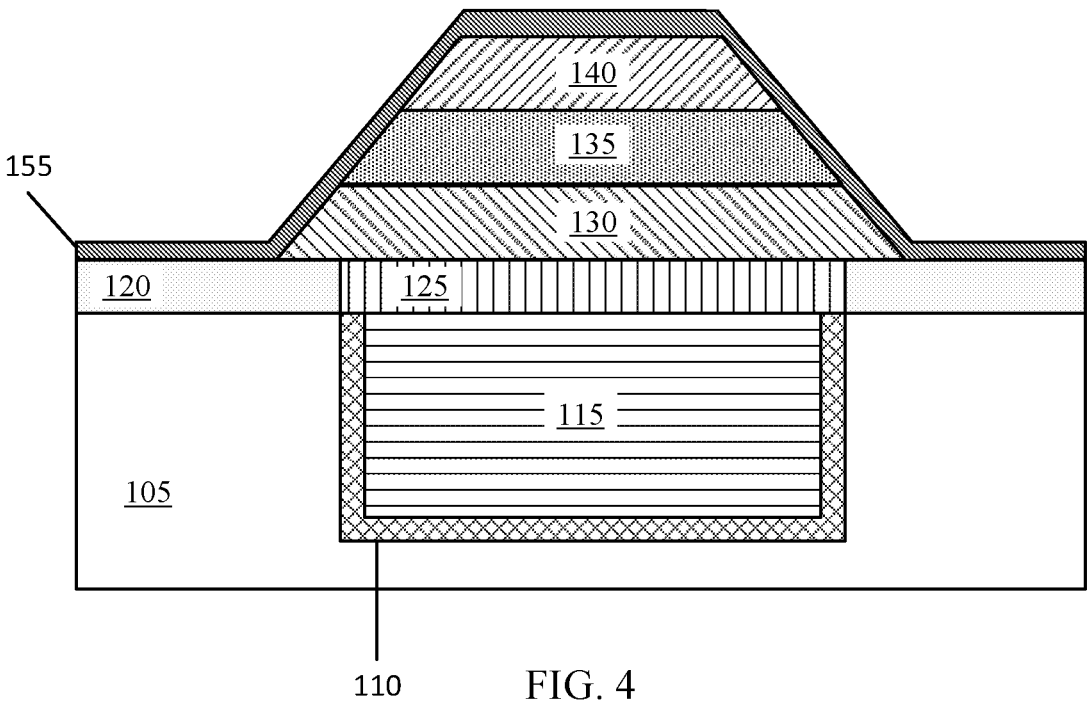
FIG. 4 illustrates a cross section of MRAM device after the formation of a first dielectric liner, in accordance with the embodiment of the present invention.
Figure 5:
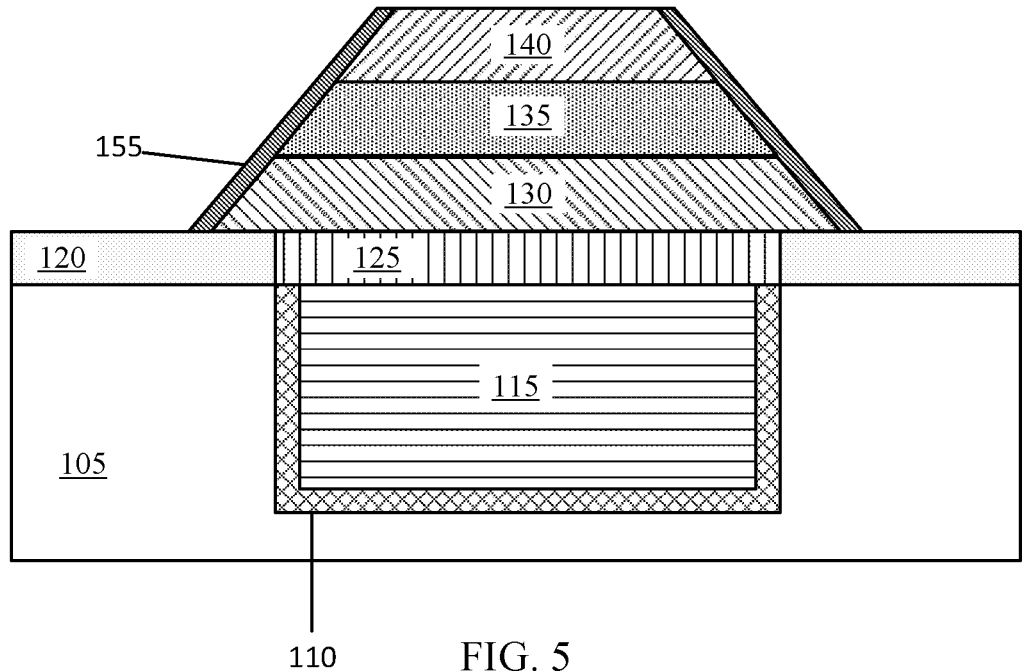
FIG. 5 illustrates a cross section of MRAM device after the etching the first dielectric liner, in accordance with the embodiment of the present invention.

FIG. 4 illustrates a cross section of MRAM device after the formation of a first dielectric liner 155, in accordance with the embodiment of the present invention. A first dielectric liner 155 is formed on the exposed surfaces of the dielectric cap 120, the sidewalls of the bottom electrode 130, the sidewalls of the synthetic anti-ferromagnet layer 135, the sidewalls and the top surface of the reference layer 140. The first dielectric liner 155 can be comprised of, for example, SiN, SiCN or SiAlN, or another suitable dielectric material. FIG. 5 illustrates a cross section of MRAM device after the etching the first dielectric liner 155, in accordance with the embodiment of the present invention. The first dielectric liner 155 is etched to remove most of the material. The first dielectric liner 155 remains located on the sidewalls of the bottom electrode 130, the sidewalls of the synthetic anti-ferromagnet layer 135, the sidewalls of the reference layer 140.

Figure 6:
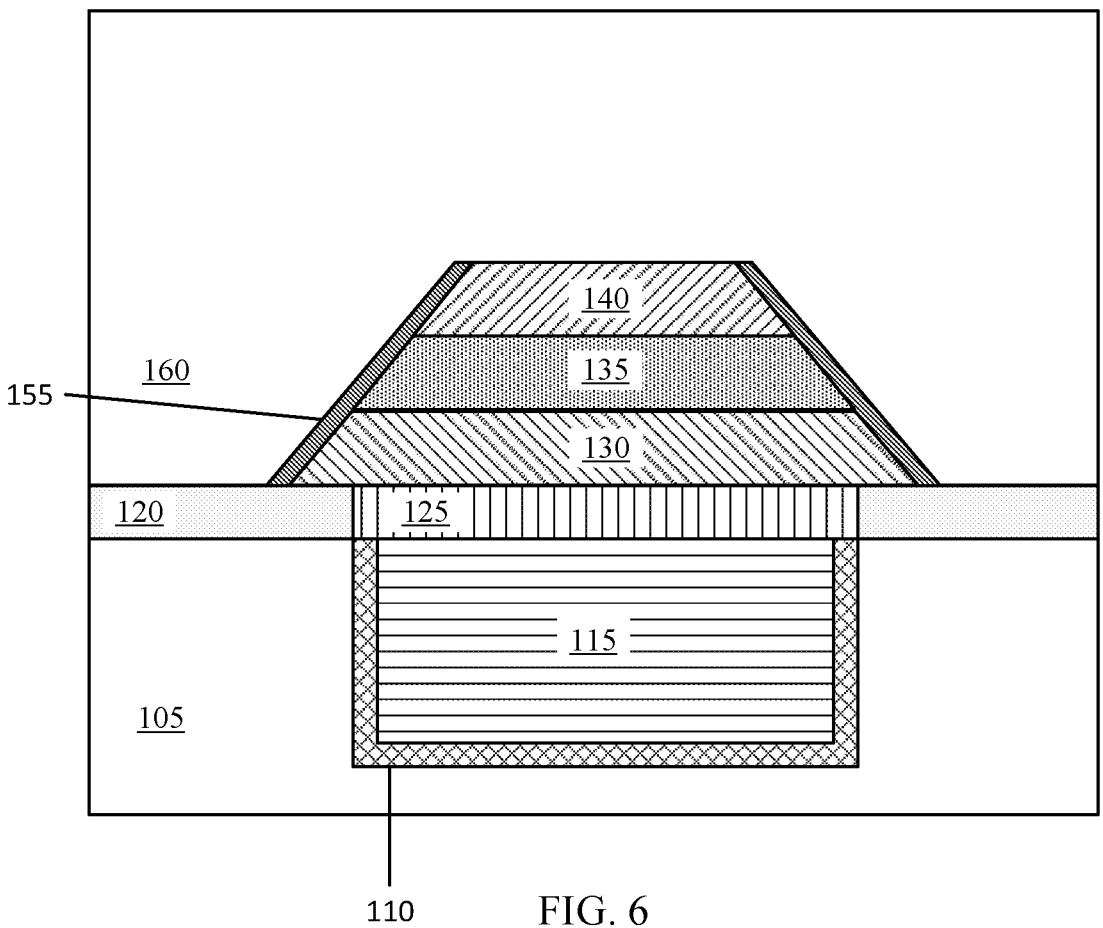
FIG. 6 illustrates a cross section of MRAM device after the formation of a second interlayer dielectric, in accordance with the embodiment of the present invention.

FIG. 6 illustrates a cross section of MRAM device after the formation of a second interlayer dielectric 160, in accordance with the embodiment of the present invention. A second interlayer dielectric 160 is formed on the exposed surfaces of the dielectric cap 120, the first dielectric liner 155, and the top surface of the reference layer 140. The second interlayer dielectric 160 can be comprised of the same material or different material as the first interlayer dielectric 105.

Figure 7:
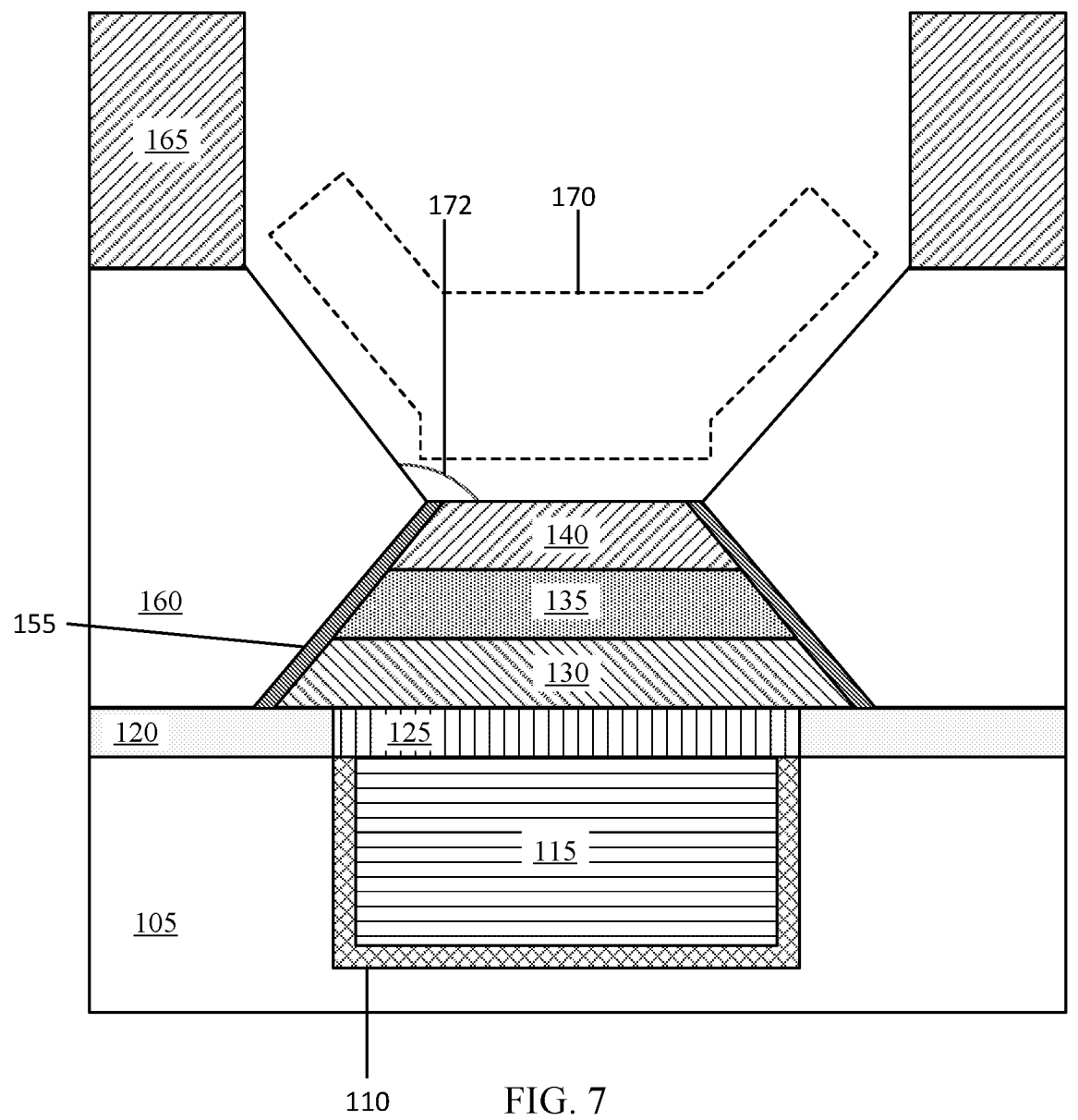
FIG. 7 illustrates a cross section of MRAM device after formation of an ultra low-K dielectric layer and after etching an upper section via, in accordance with the embodiment of the present invention.

FIG. 7 illustrates a cross section of MRAM device after formation of an ultra low-K dielectric layer 165 and after etching an upper section via 170, in accordance with the embodiment of the present invention. An ultra low-K dielectric layer 165 is located on top of the second interlayer dielectric 160. An initial via is etched into the ultra low-K dielectric layer 165, prior to etching the second interlayer dielectric 160. The initial via is widened and the second interlayer dielectric 160 is etched. The ultra low-K dielectric layer 165 has a first density and the second interlayer dielectric 160 has a second density, where the first density is less than the second density. The density difference translating into different etching rates. The upper section via 170 is formed in the second interlayered dielectric 160 and has tapered sidewalls because of the etching rate difference between the ultra low-K dielectric layer 165 and the second interlayered dielectric 160. The upper section via 170 has angled sidewalls and the overall shape of the upper section via mirrors the mesa shape of the lower section comprised of the bottom electrode 130, the synthetic anti-ferromagnet layer 135, and the reference layer 140. The angle 172 of the side walls of the upper section via 170 in the range of about 30 to 75 degrees relative to a vertical plane perpendicular to a top surface of the reference layer 140.

Figure 8:
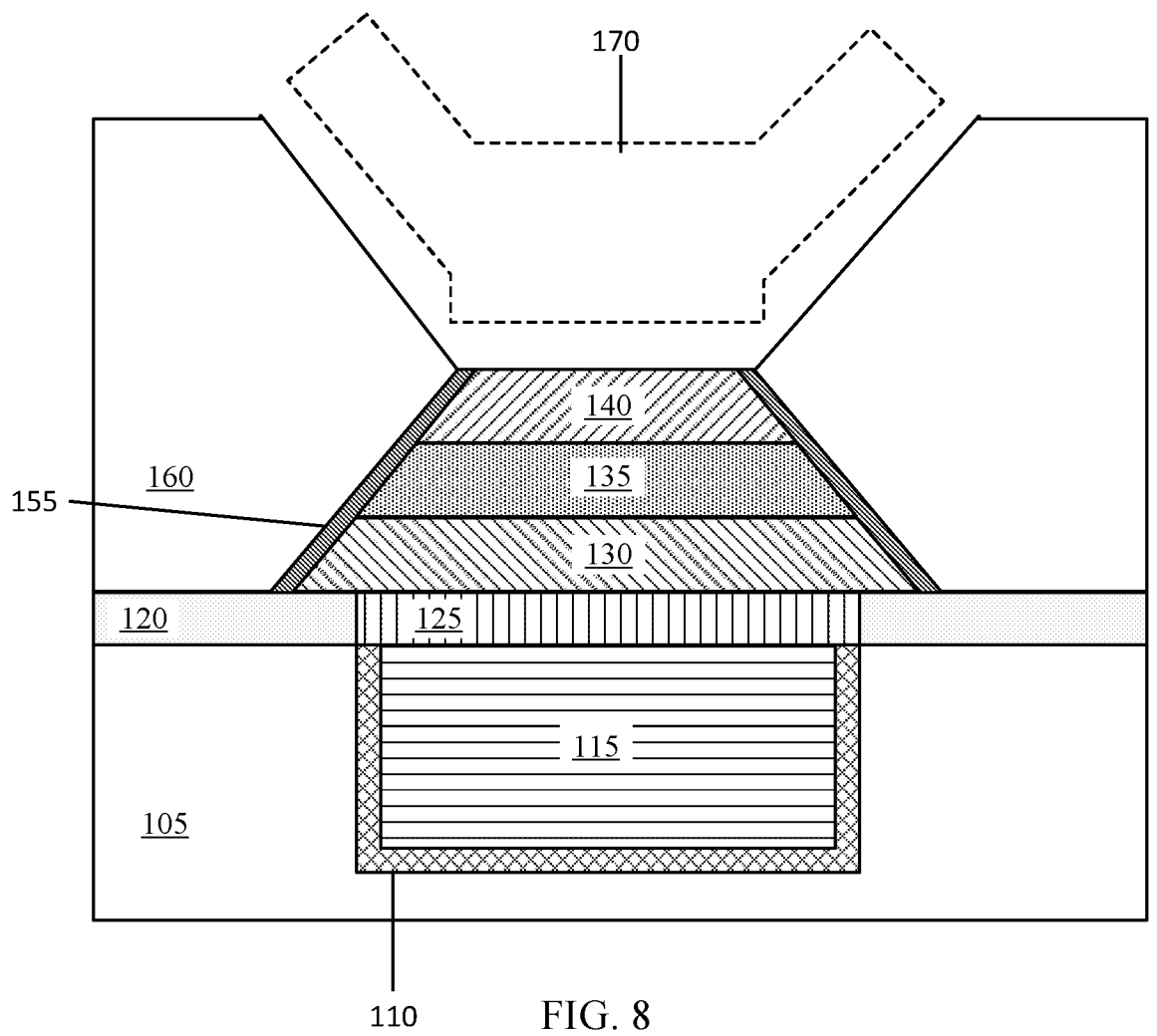
FIG. 8 illustrates a cross section of MRAM device after the removal of the ultra low-K dielectric layer, in accordance with the embodiment of the present invention.
Figure 9:
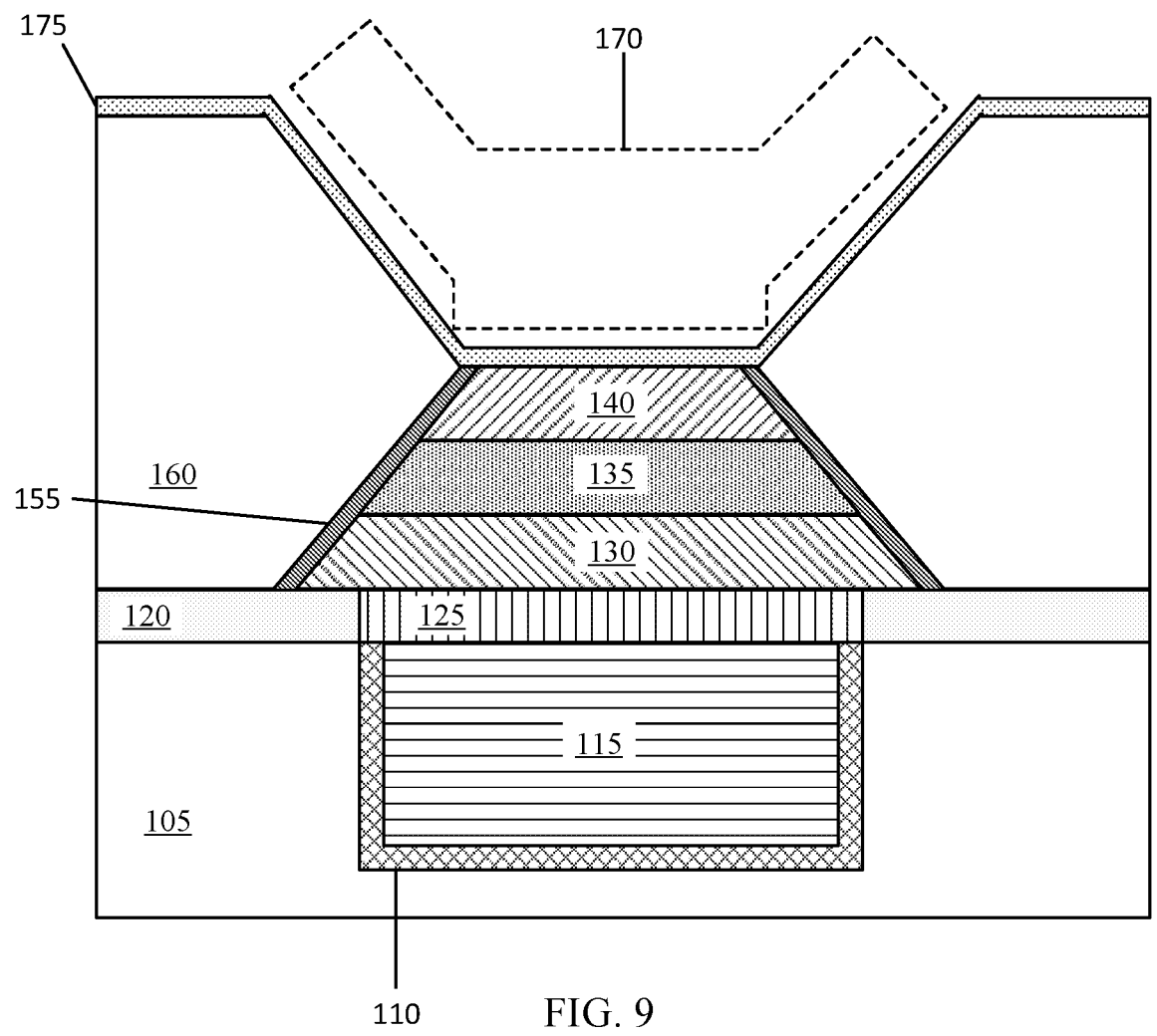
FIG. 9 illustrates a cross section of MRAM device after formation of a second dielectric liner, in accordance with the embodiment of the present invention.

FIG. 8 illustrates a cross section of MRAM device after the removal of the ultra low-K dielectric layer 165, in accordance with the embodiment of the present invention. The ultra low-K dielectric layer 165 is removed. FIG. 9 illustrates a cross section of MRAM device after formation of a second dielectric liner 175, in accordance with the embodiment of the present invention. A second dielectric liner 175 is formed on the exposed surfaces of the second interlayer dielectric 160, along the sidewalls of the upper section via 170, and on the top surface of the reference layer 140. The second dielectric liner 175 can be comprised of the same dielectric material as the first dielectric liner 155, or the second dielectric liner 175 can be comprised of a different dielectric material than the material used for the first dielectric liner 155. The second dielectric liner 175 can be comprised of, for example, SiN, SiCN or SiAlN, or another suitable dielectric material.

Figure 10:
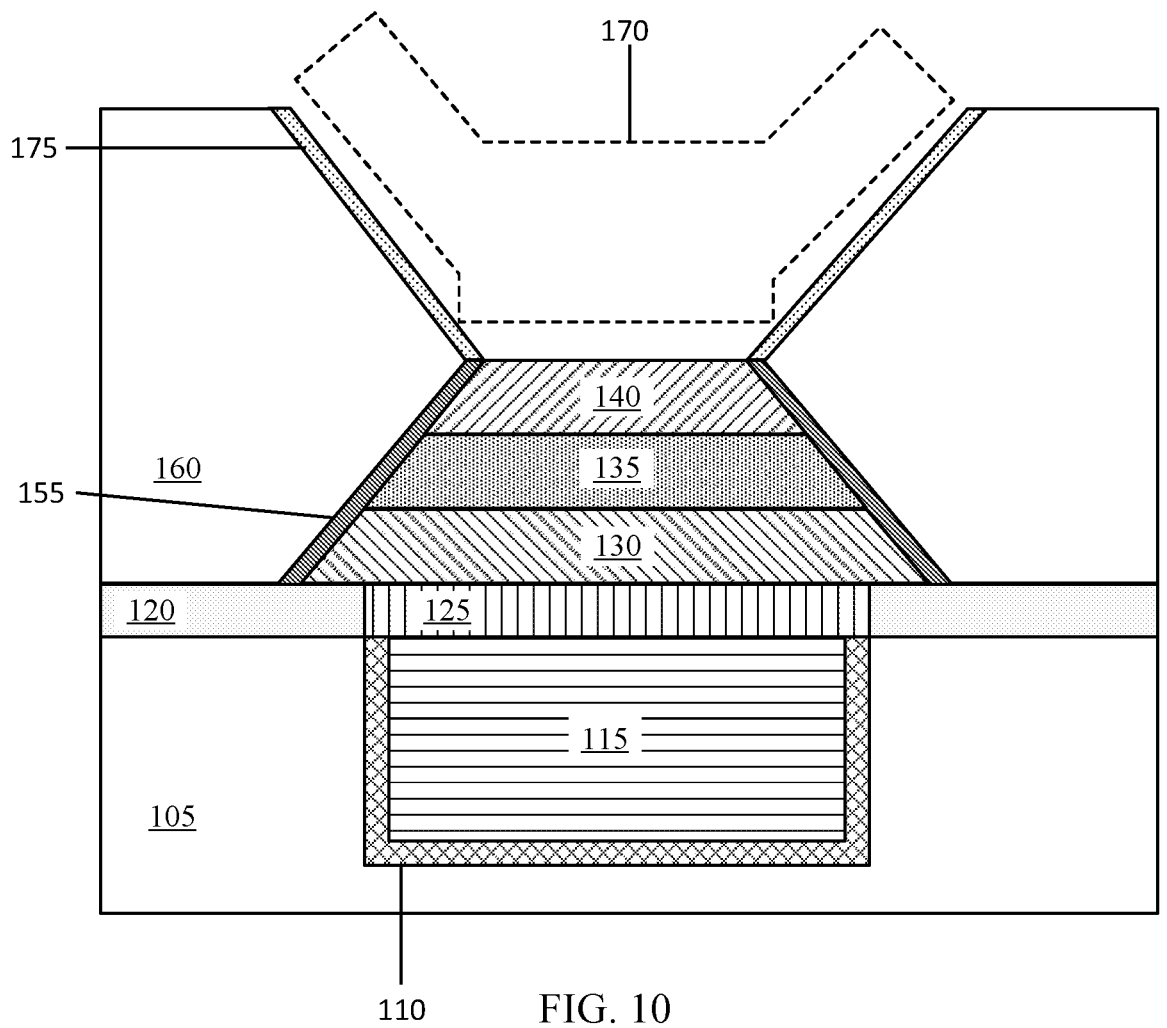
FIG. 10 illustrates a cross section of MRAM device after etching of the second dielectric liner, in accordance with the embodiment of the present invention.
Figure 11:
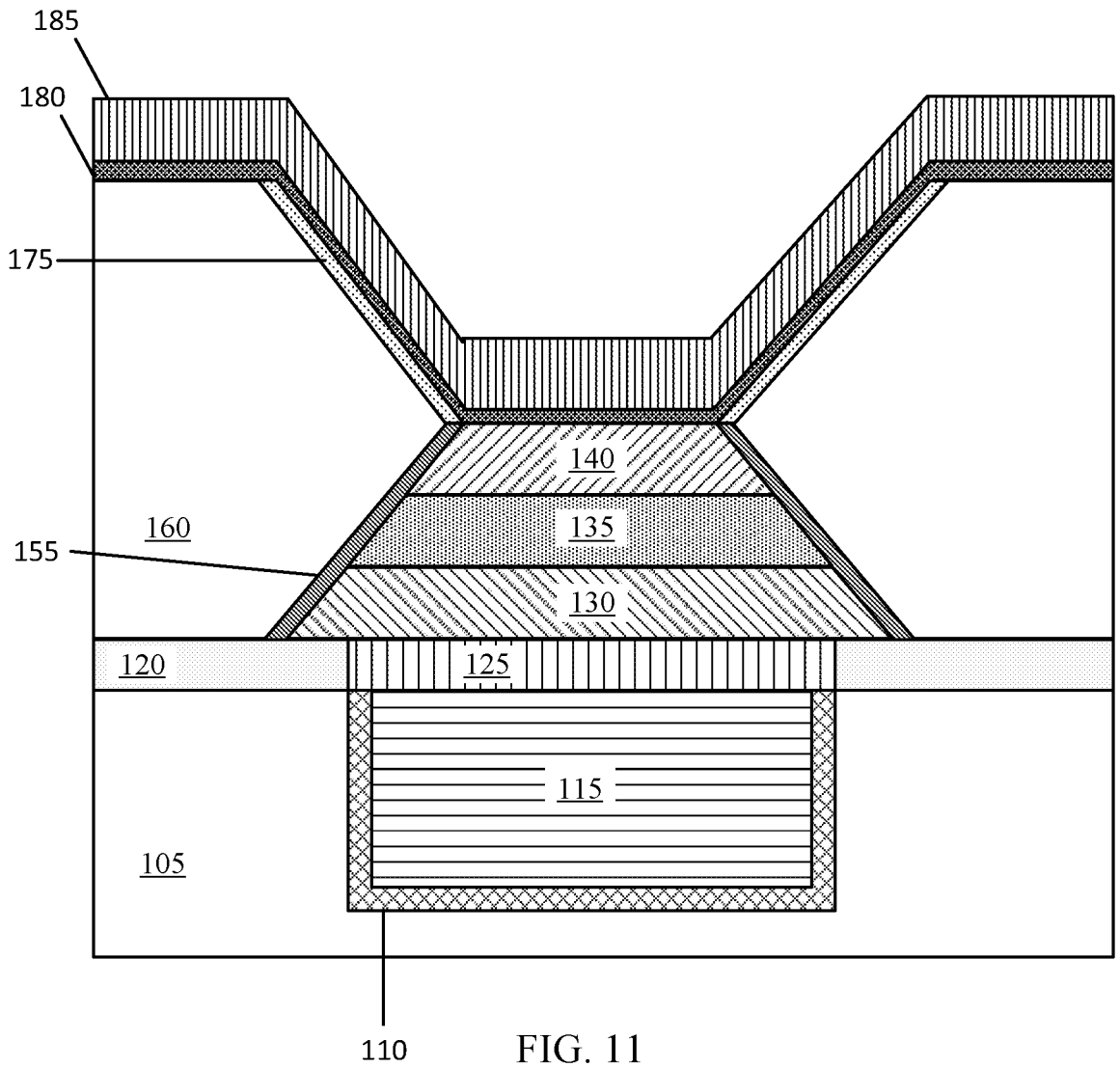
FIG. 11 illustrates a cross section of MRAM device after formation of a tunnel barrier and a free layer, in accordance with the embodiment of the present invention.

FIG. 10 illustrates a cross section of MRAM device after etching of the second dielectric liner 175, in accordance with the embodiment of the present invention. The second dielectric liner 175 is etched to remove most of the material. The second dielectric liner 175 has a portion remaining on the sidewalls of the upper section via 170. FIG. 11 illustrates a cross section of MRAM device after formation of a tunnel barrier layer 180 and a free layer 185, in accordance with the embodiment of the present invention. The tunnel barrier layer is formed on the top surface of the second interlayer dielectric 160, the top surface of the second dielectric liner 175, and on the top surface of the reference layer 140. The tunnel barrier layer 180 has a thickness in a range of about 1 to 5 nm. The tunnel barrier layer 180 can be selected from a group that includes MgO or $Al_2O_3$. The tunnel barrier layer 180 has a U-shape comprised of a flat bottom section located on the reference layer 140 and angled side sections located on top of the second dielectric liner 175. Since the tunnel barrier layer 180 is formed after the second dielectric liner 175 has been etched, then the tunnel barrier layer 180 is protected from back scattering of materials. The lower layers 148 of the MRAM device are etch prior to the deposition of the tunnel barrier layer 180, thus preventing material from the lower layers from being scattered back on to the tunnel barrier layer 180. The free layer 185 is formed on top of the tunnel barrier layer 180. The free layer 185 has a thickness in a range of about 10 to 30 nm. The free layer 185 can be selected from a group that includes CoFeB multi-layers with Mo, Pt, or Ta.

Figure 12:
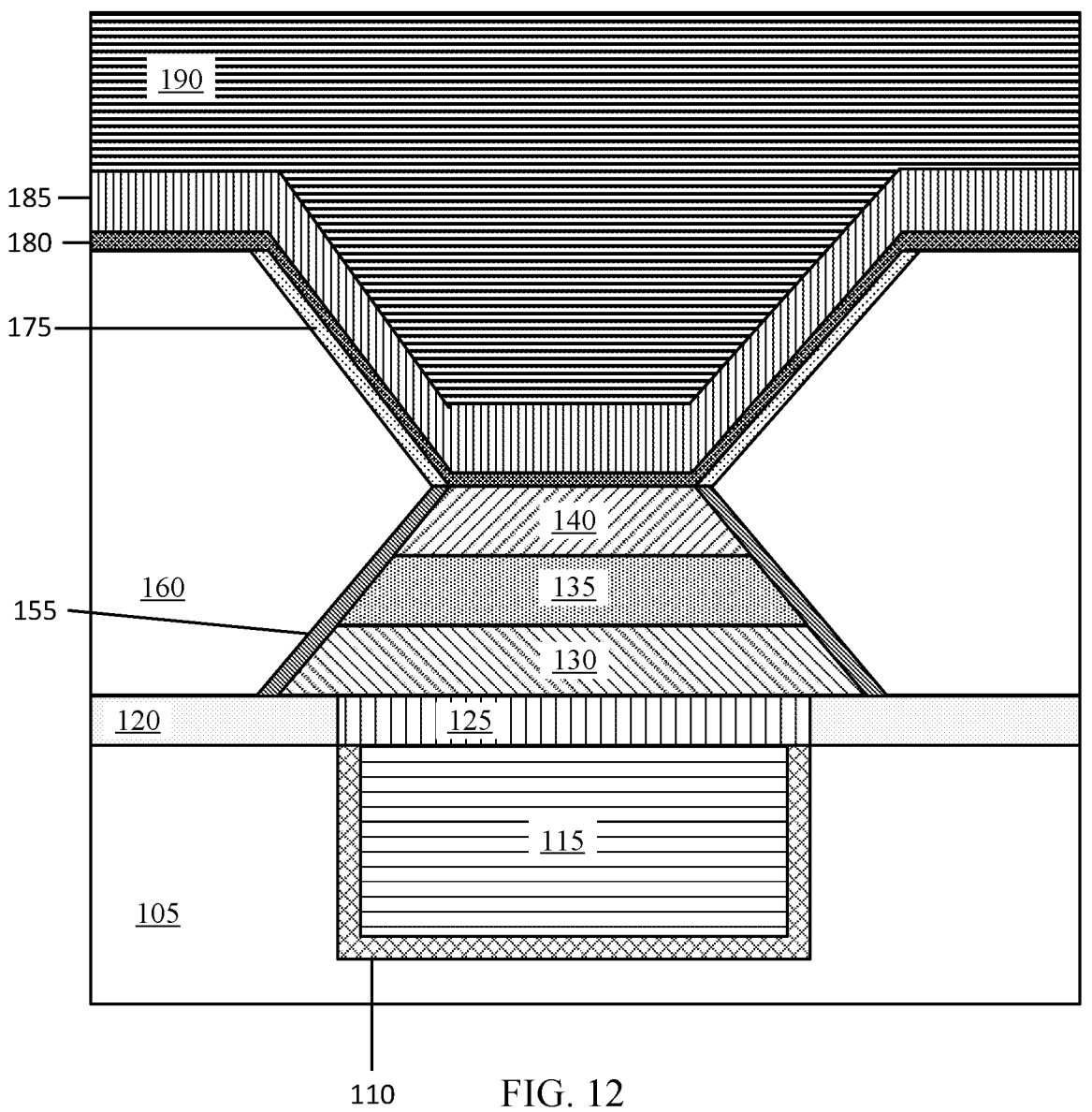
FIG. 12 illustrates a cross section of MRAM device after formation of a top electrode, in accordance with the embodiment of the present invention.

FIG. 12 illustrates a cross section of MRAM device after formation of a top electrode 190, in accordance with the embodiment of the present invention. A top electrode 190 is formed on top of the free layer 185. The top electrode 190 fills the void remaining in the upper section via 170 after the formation of the free layer 185. The top electrode 190 can be comprised of, for example, TiN, TaN, WN, MoN, Ti, Ru, other suitable conductive metals, conductive alloys, or a combination thereof.

Figure 13:
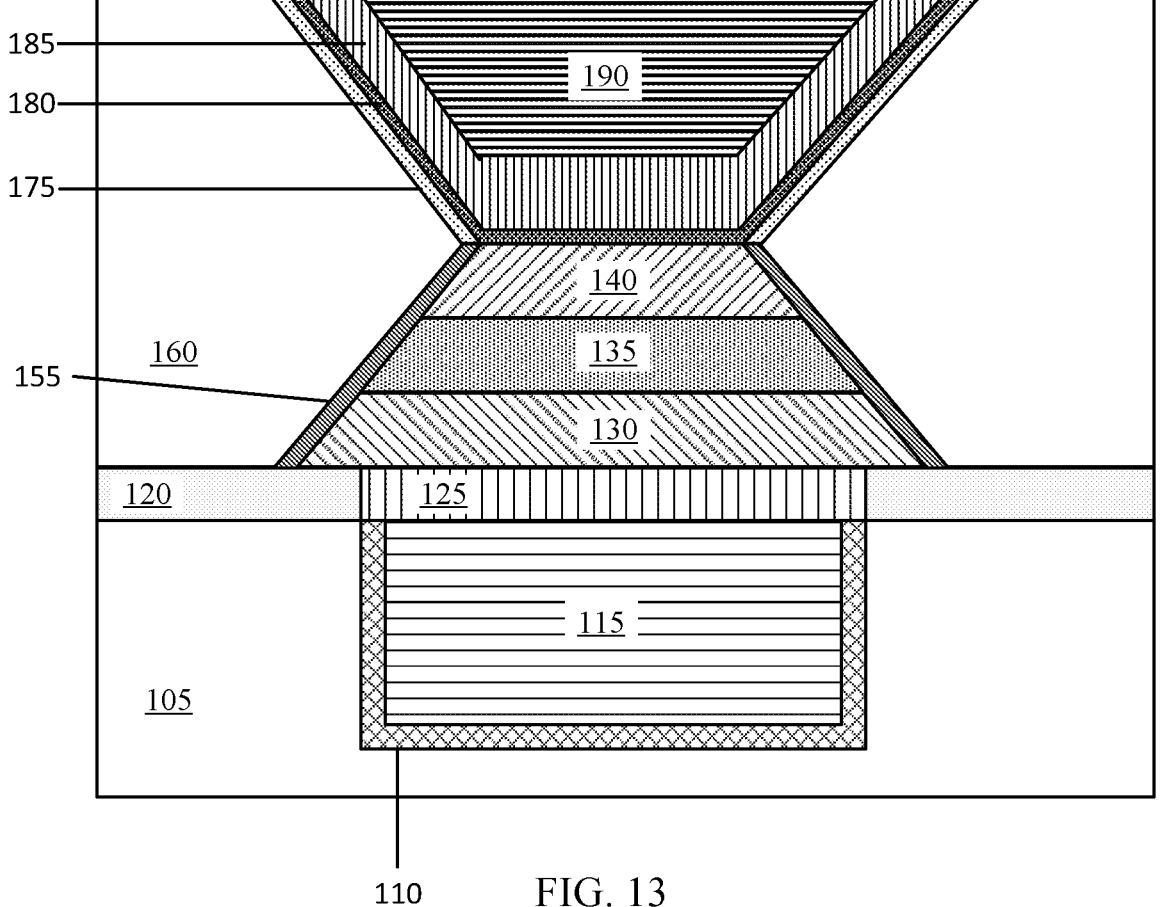
FIG. 13 illustrates a cross section of MRAM device after planarization to create a uniform top surface, in accordance with the embodiment of the present invention.
Figure 14:
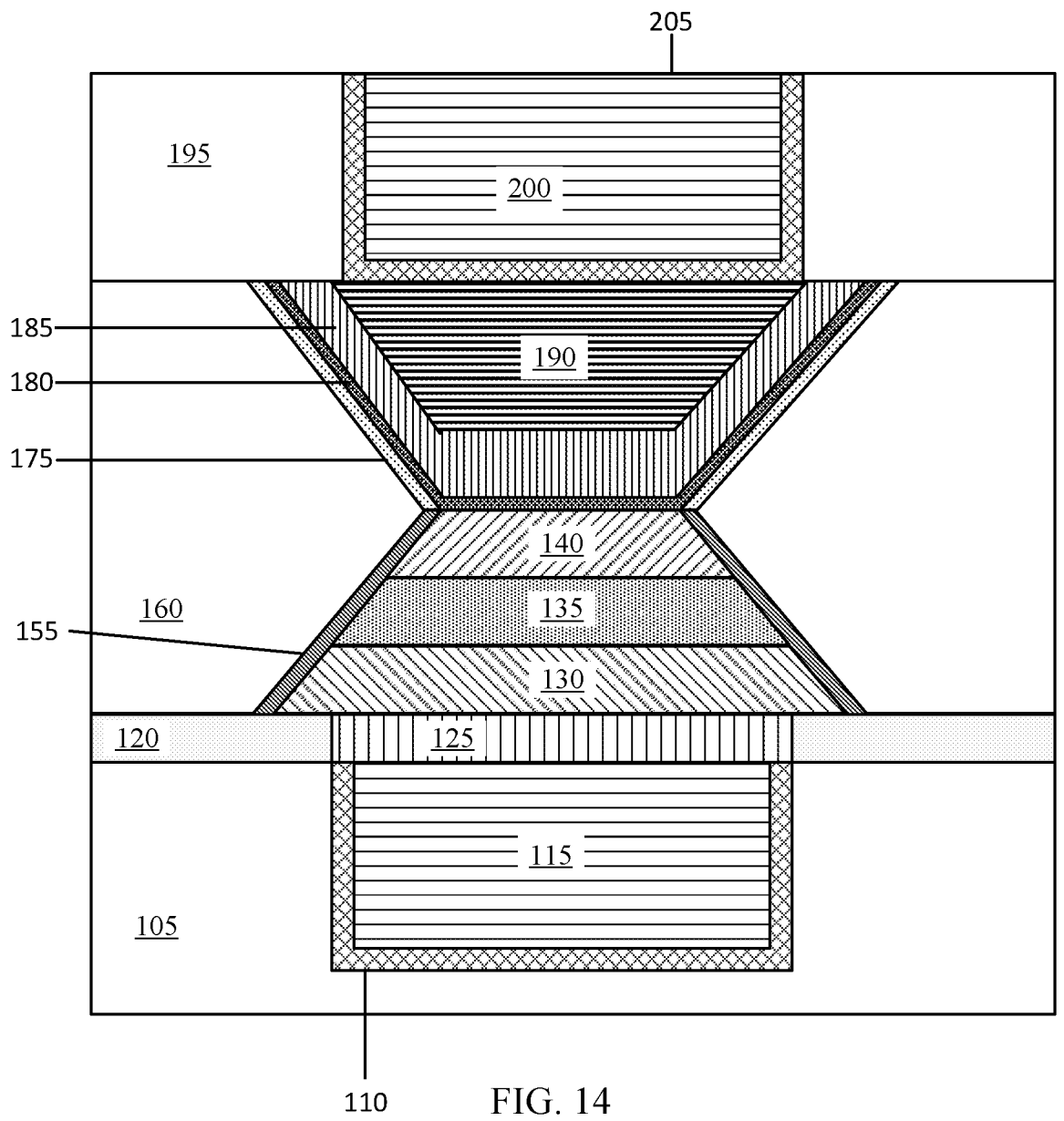
FIG. 14 illustrates a cross section of MRAM device after formation of a top metal contact, in accordance with the embodiment of the present invention.

FIG. 13 illustrates a cross section of MRAM device after planarization to create a uniform top surface, in accordance with the embodiment of the present invention. The top electrode 190, the free layer 185, and the tunnel barrier layer 180 are planarized to create a uniform surface across the top surface of the second interlayer dielectric 160. Since the layers are planarized there is no chance of material being back scattered on to the sidewalls of the tunnel barrier layer 180. FIG. 14 illustrates a cross section of MRAM device after formation of a top metal contact 200, in accordance with the embodiment of the present invention. A third interlayer dielectric 195 is formed on unformed top surface. An upper metal contact 200 and a lower metal liner 205 are formed on top of the top electrode 190. The MRAM cell will have a final shape that is similar to an hourglass shape or hyperboloid shape, where the narrowest section is located at the intersection of the reference layer 140 and the tunnel barrier layer 180.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. An MRAM cell comprising:
   the MRAM cell having an hourglass shape, wherein the hourglass shape is defined by a plurality of layers, wherein the MRAM cell is comprised of a lower section and an upper section, where the lower section of the MRAM cell is comprised a bottom electrode, a synthetic anti-ferromagnet layer, and a reference layer.

2. The MRAM cell of claim 1, wherein a top surface of the reference layer has a first width, and a bottom surface of the reference layer has a second width, and wherein the first width is less than the second width.

3. The MRAM cell of claim 2, wherein a top surface of the synthetic anti-ferromagnet layer is substantial equal to the second width and a bottom surface of the synthetic anti-ferromagnet layer has a third width, and wherein the second width is less than the third width.

4. The MRAM cell of claim 3, wherein a top surface of the bottom electrode is substantial equal to the third width and a bottom surface of the bottom electrode has a fourth width, and wherein the third width is less than the fourth width.

5. The MRAM cell of claim 4, further comprising:
a dielectric cap, wherein the MRAM cell is located on top of the dielectric cap, wherein a sidewall of each the bottom electrode, the synthetic anti-ferromagnet layer, and the reference layer are at an angle relative to a vertical plane perpendicular to a top surface of the dielectric cap.

6. The MRAM cell of claim 5, wherein the angle of the sidewalls of each the bottom electrode, the synthetic anti-ferromagnet layer, and the reference layer is in a range of about 30 to 75 degrees relative to the vertical plane perpendicular to a top surface of the dielectric cap.

7. The MRAM cell of claim 6, further comprising:
a first dielectric liner located on the sidewalls of each the bottom electrode, the synthetic anti-ferromagnet layer, and the reference layer, respectively.

8. The MRAM cell of claim 7, further comprising:
where the upper section of the MRAM cell is comprised a tunnel barrier, a free layer, and a top electrode.

9. The MRAM cell of claim 8, wherein a shape of the upper section mirrors the shape of the lower section.

10. The MRAM cell of claim 9, further comprising:
a second dielectric liner located along a sidewall of the tunnel barrier layer.

11. An MRAM Cell comprising:
a dielectric cap;
a lower section located on top of the dielectric cap, wherein the lower section includes/comprises a bottom electrode, a synthetic anti-ferromagnet layer, and a reference layer, wherein in a sidewall of each of the bottom electrode, the synthetic anti-ferromagnet layer, and the reference layer are angled relative to the vertical plane perpendicular to a top surface of the dielectric cap;
a first dielectric liner located on the sidewalls of each of the bottom electrode, the synthetic anti-ferromagnet layer, and the reference layer, wherein the first dielectric liner is comprised of a first material;
an upper section that includes a tunnel barrier, a free layer, and a top electrode, wherein the tunnel barrier has a horizontal bottom section located on top of the reference layer, wherein the tunnel barrier has angled vertical sided sections;
a second dielectric liner located on a side section of the tunnel barrier, wherein the second dielectric liner is comprised of a second material, and wherein the angled side sections of the tunnel barrier are located on top of the second dielectric liner.

12. The MRAM cell of claim 11, wherein the first material and the second material are the same.

13. The MRAM cell of claim 11, wherein the first material and the second material are different.

14. The MRAM cell of claim 11, wherein a top surface of the reference layer has a first width and a bottom surface of the reference layer has a second width, and wherein the first width is less than the second width.

15. The MRAM cell of claim 14, wherein a top surface of the synthetic anti-ferromagnet layer is substantial equal to the second width and a bottom surface of the synthetic anti-ferromagnet layer has a third width, and wherein the second width is less than the third width.

16. The MRAM cell of claim 15, wherein a top surface of the bottom electrode is substantial equal to the third width and a bottom surface of the bottom electrode has a fourth width, and wherein the third width is less than the fourth width.

17. An MRAM cell comprising: the MRAM cell having a hyperboloid shape, wherein the hyperboloid shape is defined by a plurality of layers, wherein the MRAM cell is comprised of a lower section and an upper section, wherein the location where the lower and upper section width narrows at a location where the lower and upper section are in contact with each other, where the lower section of the MRAM cell is comprised of a bottom electrode, a synthetic anti-ferromagnet layer, and a reference layer.

\* \* \* \* \*